(12) United States Patent
Zhu et al.

(10) Patent No.: US 12,342,695 B2
(45) Date of Patent: Jun. 24, 2025

(54) DISPLAY SUBSTRATE, DISPLAY MOTHERBOARD AND DISPLAY PANEL RELATED THERETO

(71) Applicants: YUNNAN INVENSIGHT OPTOELECTRONICS TECHNOLOGY CO., LTD., Yunnan (CN); BOE TECHNOLOGY GROUP CO., LTD., Beijing (CN)

(72) Inventors: Zhijian Zhu, Beijing (CN); Pengcheng Lu, Beijing (CN); Junbo Wei, Beijing (CN); Xiao Bai, Beijing (CN); Jie Sun, Beijing (CN); Yage Song, Beijing (CN); Shengji Yang, Beijing (CN); Xiaochuan Chen, Beijing (CN)

(73) Assignees: Yunnan Invensight Optoelectronics Technology Co., Ltd., Yunnan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/794,829

(22) PCT Filed: Sep. 30, 2021

(86) PCT No.: PCT/CN2021/122077
§ 371 (c)(1),
(2) Date: Jul. 22, 2022

(87) PCT Pub. No.: WO2023/050267
PCT Pub. Date: Apr. 6, 2023

(65) Prior Publication Data
US 2024/0196670 A1 Jun. 13, 2024

(51) Int. Cl.
*H10K 59/131* (2023.01)
*H10K 59/95* (2023.01)

(52) U.S. Cl.
CPC .......... *H10K 59/131* (2023.02); *H10K 59/95* (2023.02)

(58) Field of Classification Search
None
See application file for complete search history.

(56) References Cited

U.S. PATENT DOCUMENTS

2002/0080461 A1* 6/2002 Karasawa ............. G02F 1/1345
359/254
2009/0267193 A1 10/2009 Hayasaki
(Continued)

FOREIGN PATENT DOCUMENTS

| CN | 101425517 A | 5/2009 |
|---|---|---|
| CN | 102214618 A | 10/2011 |

(Continued)

OTHER PUBLICATIONS

China Second Office Action, Application No. 202180002772.7, dated Jul. 19, 2024, 13 pps.: with English translation.

*Primary Examiner* — Kyoung Lee
(74) *Attorney, Agent, or Firm* — Armstrong Teasdale LLP

(57) ABSTRACT

Embodiments of the present disclosure provide a display substrate, a related display motherboard, and a related display panel. The display substrate has a central region and a peripheral region surrounding the central region. The display substrate includes a substrate, a dielectric layer located on the substrate and including a first portion and a second portion arranged in sequence in a direction perpendicular to the substrate, a pad located within the peripheral region and on a surface of the second portion on a side away from the substrate, and a conductive sealing part located within the peripheral region and in the dielectric layer, wherein the conductive sealing part includes at least a first portion adjacent to the pad in a direction parallel to the (Continued)

substrate, and wherein the first portion of the conductive sealing part is covered by the second portion of the dielectric layer.

20 Claims, 5 Drawing Sheets

(56) References Cited

U.S. PATENT DOCUMENTS

| | | |
|---|---|---|
| 2010/0148661 A1 | 6/2010 | Farquhar et al. |
| 2012/0012843 A1 | 1/2012 | Matsubara |

FOREIGN PATENT DOCUMENTS

| | | |
|---|---|---|
| CN | 103098215 A | 5/2013 |
| CN | 103268883 A | 8/2013 |
| CN | 103956435 A | 7/2014 |
| CN | 104009024 A | 8/2014 |
| CN | 104795357 A | 7/2015 |
| CN | 105247701 A | 1/2016 |
| CN | 107731851 A | 2/2018 |
| CN | 110350013 A | 10/2019 |
| CN | 110571321 A | 12/2019 |
| CN | 111443539 A | 7/2020 |
| CN | 112750765 A | 5/2021 |
| JP | 2013074113 A | 4/2013 |

\* cited by examiner

DISPLAY SUBSTRATE, DISPLAY MOTHERBOARD AND DISPLAY PANEL RELATED THERETO

CROSS REFERENCE TO RELATED APPLICATIONS

This patent application is a National Stage Entry of PCT/CN2021/122077 filed on Sep. 30, 2021, the disclosure of which is incorporated by reference herein in its entirety as part of the present application.

BACKGROUND

Embodiments of the present disclosure relate to the field of display technology, and more particularly, to a display substrate, a display motherboard, and a display panel.

In recent years, with the increasing maturity of AR (Augmented Reality) and VR (Virtual Reality) technologies, there are demands of people for display devices suitable for AR and VR applications with small size, light weight, high contrast, fast response speed, and effective power consumption. Therefore, micro-organic light-emitting diode (Micro-OLED) microdisplays with these advantages have attracted extensive attention.

BRIEF DESCRIPTION

Embodiments of the present disclosure provide a display substrate, a related display motherboard, and a related display panel.

A first aspect of the present disclosure provides a display substrate. The display substrate includes a central region and a peripheral region surrounding the central region. The display substrate includes a substrate, a dielectric layer located on the substrate and including a first portion and a second portion arranged in sequence in a direction perpendicular to the substrate, a pad located within the peripheral region on the substrate, wherein at least a portion of a surface of the pad on a side facing away from the substrate is exposed, and a conductive sealing part located within the peripheral region and in the dielectric layer, wherein the conductive sealing part includes at least a first portion adjacent to the pad in a direction parallel to the substrate, and wherein the first portion of the conductive sealing part is covered by the second portion of the dielectric layer.

In some embodiments of the present disclosure, the second portion of the dielectric layer includes a number of sub-dielectric layers, and the number of sub-dielectric layers is less than or equal to three.

In some embodiments of the present disclosure, the conductive sealing part further includes a second portion not adjacent to the pad in the direction parallel to the substrate, and the second portion extends to a top surface of the second portion of the dielectric layer away from the substrate.

In some embodiments of the present disclosure, the conductive sealing part includes conductive via layers and conductive wiring layers alternately stacked in the direction perpendicular to the substrate.

In some embodiments of the present disclosure, the conductive wiring layers include a first conductive wiring layer closest to the substrate in the direction perpendicular to the substrate, as a bottom layer of the conductive sealing part.

In some embodiments of the present disclosure, a material of the first conductive wiring layer includes a semiconductor.

In some embodiments of the present disclosure, the semiconductor includes polysilicon.

In some embodiments of the present disclosure, the conductive wiring layers further include a second conductive wiring layer located above the first conductive wiring layer. A material of the second conductive wiring layer includes metal.

In some embodiments of the present disclosure, the first portion of the conductive sealing part including any of the following configurations: 6 conductive wiring layers and 6 conductive via layers: 6 conductive wiring layers and 5 conductive via layers: 5 conductive wiring layers and 5 conductive via layers: or 7 conductive wiring layers and 6 conductive via layers.

In some embodiments of the present disclosure, the pad is located in the second portion of the dielectric layer.

In some embodiments of the present disclosure, the conductive sealing part has an annular shape surrounding the central region.

In some embodiments of the present disclosure, the conductive sealing part includes a first ring portion and a second ring portion arranged in sequence in a direction away from the central region.

In some embodiments of the present disclosure, the annular shape is rectangle.

In some embodiments of the present disclosure, the conductive sealing part includes a corner. The display substrate further includes a reinforced part located in the dielectric layer within the peripheral region and adjacent to the corner. The reinforced part has a shape complementary to the corner.

In some embodiments of the present disclosure, the reinforced part has a mesh structure.

In some embodiments of the present disclosure, the display substrate includes a plurality of pads parallel to each other and spaced apart and a space between the any two adjacent pads is a first distance. The display motherboard further includes a cutting region between adjacent display substrates. The cut region includes test pads. The dimension of the test pad adjacent to the pad in a direction in which the pad is arranged is smaller than the first distance.

In some embodiments of the present disclosure, the display substrate includes a backplane driving integrated circuit.

In some embodiments of the present disclosure, a material of the substrate includes a semiconductor material.

A second aspect of the present disclosure provides a display motherboard. The display motherboard includes any display substrate according to the first aspect.

In some embodiments of the present disclosure, the display motherboard further includes a test pad and a dummy pattern located within a cutting region of the adjacent display substrate. The dummy pattern is located between the test pad and the pad adjacent to the test pad.

In some embodiments of the present disclosure, a space between the test pad and the pad adjacent to the test pad is configured to be greater than a minimum space between adjacent conductive wirings of the display substrate in the direction parallel to the substrate.

In some embodiments of the present disclosure, the space is 40 μm-80 μm.

In some embodiments of the present disclosure, the dummy pattern is a square shape of 3 μm×3 μm.

A third aspect of the present disclosure provides a display panel. The display panel includes any display substrate according to the first aspect.

In some embodiments of the present disclosure, the display panel further includes a circuit board. The circuit board is electrically connected to the display substrate via the pads.

In some embodiments of the present disclosure, the circuit board includes a flexible circuit board.

Further aspects and scope of adaptability will become apparent from the description provided herein. It should be understood that various aspects of the present application may be implemented alone or in combination with one or more other aspects. It should also be understood that the description and specific examples herein are intended for purposes of illustration only and are not intended to limit the scope of the application.

BRIEF DESCRIPTION OF THE DRAWINGS

The drawings described herein are only for purposes of illustrating selected embodiments but not all possible implementations, and not intended to limit the scope of the application, in which.

Corresponding reference numerals indicate corresponding parts or features throughout the various views of the drawings.

DETAILED DESCRIPTION

Figure 1:
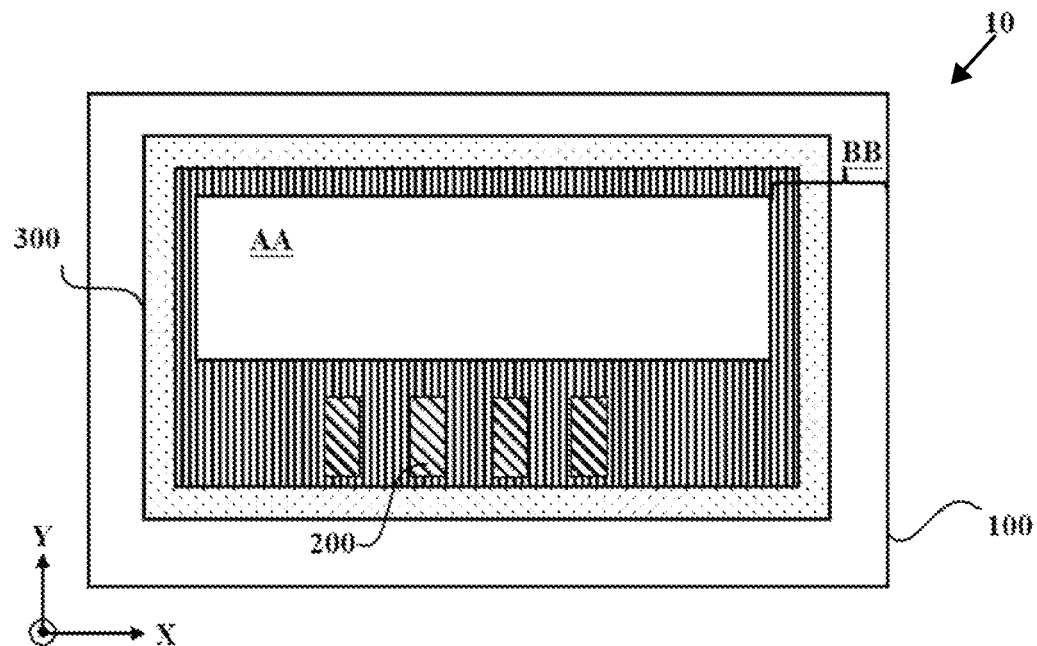
FIG. 1 shows a top view of a display substrate in the related art.

First, it should be noted that unless clearly dictated in the context otherwise, the singular forms of words used herein and in the appended claims include the plural, and vice versa. Thus, when referring to the singular, the plural of the corresponding term is generally included. Similarly, the words "comprising" and "including" are to be interpreted as inclusively rather than exclusively. Likewise, the terms "including" and "or" should be construed to be inclusive unless otherwise indicated herein. Where the term "examples" is used herein, particularly when it follows a listing of terms is merely exemplary and illustrative, and should not be deemed to be exclusive or comprehensive.

In addition, it should also be noted that when introducing elements of the present application and embodiments thereof, the articles "a", "an", "the", and "said" are intended to mean that there are one or more of the elements; unless otherwise stated, "a plurality of" means two or more; the terms "comprising", "including", "containing" and "having" are intended to be inclusive and mean that there may be additional elements other than the listed elements; the terms "first", "second", "third", etc. are used for descriptive purposes only and should not be construed to indicate or imply relative importance and formation order.

Further, in the drawings, the thicknesses and area of various layers are exaggerated for clarity. It could be understood that when a layer, region, or component is referred to be "on" another part, which means that it is directly on the other part, or other components may also be between them. Conversely, when a component is referred to be "directly" on the top of another component, it means that no other component is between them.

As mentioned above, with the development of AR and VR technologies, organic light-emitting diode microdisplays with small size, light weight, high contrast, fast response speed, and effective power consumption have been in focus. In order to improve the yield of OLED microdisplays, in addition to improving the fabricating process of traditional OLED displays, for example, it is necessary to further improve the design and layout of the backplane driving integrated circuit/chip in the display, so as to solve the problem of undesirable electrical connection in the prior art.

Generally, organic light emitting diode microdisplays generally include a display substrate and a circuit board bonded thereto, such as a flexible printed circuit board (FPC). The display substrate may include a backplane driving integrated circuit (BP Driver) IC. The backplane driver integrated circuit IC can perform image processing functions such as temperature compensation, brightness control, gamma correction, and the like. FIG. 1 shows a top view of a display substrate in related art. As shown in FIG. 1, the display substrate 10 includes a central region AA and a peripheral region BB surrounding the central region AA. The central region AA may refer to a display region. The peripheral region BB may refer to a non-display region. In order to achieve color display, the display region AA includes an emission source emitting white light and a color filter (CF) absorbing specific wavelengths. In addition, since the elements and materials in the display substrate 10 are easily oxidized, the thin film encapsulation (TFE) technology needs to be used to isolate water and oxygen in the air. As further shown in FIG. 1, the display substrate 10 further includes a substrate 100, a pad 200, and a conductive sealing part 300. The pad 200 is located within the peripheral region BB of the substrate 100. The conductive sealing part 300 may include a sealing ring. The conductive sealing part 300 can be used to prevent stress generated by cutting a display motherboard including a plurality of display substrates from acting on the central region AA, thereby avoiding performance degradation of the display substrate 10.

A circuit board such as a flexible printed circuit board is bonded to the pads 200 on the display substrate 10 through bonding pads (also called gold fingers) thereon. The bonding pads may be undesirably electrically connected (e.g., shorted) to the conductive sealing part 300 of the display substrate 10, due to design deviations of the bonding pads or alignment deviations of the bonding.

The present disclosure provides a display substrate that avoids the above-mentioned problems of undesired electrical connections such as short circuits, by redesigning the structure.

Figure 2:
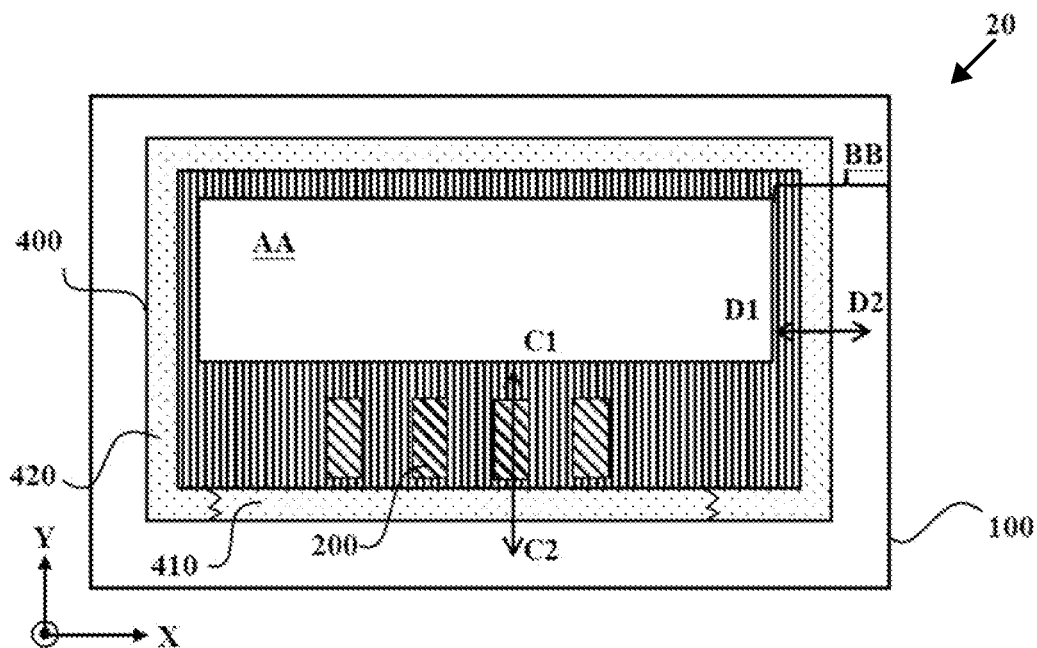
FIG. 2 shows a top view of a display substrate according to an embodiment of the present disclosure.

The structure of the display substrate according to the embodiment of the present disclosure will be described below with reference to FIGS. 2 to 4. As shown in FIG. 2, similar to the display substrate 10 as shown in FIG. 1, the display substrate 20 also includes the central region AA, the peripheral region BB, the substrate 100, and the pad 200. In an embodiment of the present disclosure, a material of the substrate 100 includes a semiconductor material, e.g., a material including silicon. At least a portion of a surface (e.g., an upper surface) of the pad 200 on a side away from the substrate 100 is exposed. As shown in FIG. 2, the upper surface of the pad 200 is exposed. In the embodiments of the present disclosure, "up" and "down" are described with respect to the Z direction (i.e., a direction perpendicular to the substrate).

In the display substrate 20 according to the present disclosure, the conductive sealing part 400 includes a first portion 410 adjacent to the pad 200 in a direction parallel to the substrate 100. In an embodiment of the present disclosure, the conductive sealing part 400 further includes a second portion 420 that is not adjacent to the pad 200 in the direction parallel to the substrate 100. As shown in FIG. 2, the second portion 420 is not adjacent to the pad 200 in the Y direction. The term "a portion of an element S is adjacent to an element M in the N direction" means that a distance between the portion of the element S and the element M in the N direction is shorter than another portion of the element S. The term "the portion of an element S is not adjacent to the element M in the N direction" means that the distance between the portion of the element S and the element M in the N direction is longer than another portion of the element S.

Furthermore, in the embodiment of the present disclosure, the conductive sealing part 400 has an annular shape around the central region AA, which may be closed or not closed. As shown in FIG. 2, according to an embodiment of the present disclosure, the annular shape may be rectangular. The first portion 410 of the conductive sealing part 400 may be a portion corresponding to one side of the rectangular conductive sealing part 400. It should be understood that this is only an example, and the first portion 410 may also be other portions of the rectangular conductive sealing part 400 adjacent to the pad 200. In addition, according to an embodiment of the present disclosure, the conductive sealing part 400 may be coupled with a ground terminal of the application circuit to shield an external magnetic field, thereby protecting the circuit in the central region AA from the external magnetic field.

According to an embodiment of the present disclosure, the conductive sealing part 400 may include a first ring portion (not shown) and a second ring portion (not shown) arranged in sequence in a direction away from the central region AA. In the embodiment, the width of the first ring portion, which is closer to the central region AA than the second ring portion, may be 10 μm. The width of the second ring portion may be 4 μm. A space between the first ring portion and the second ring portion may be 2 μm. In other embodiments of the present disclosure, other widths and spaces of the first ring portion and the second ring portion are possible.

Figure 3:
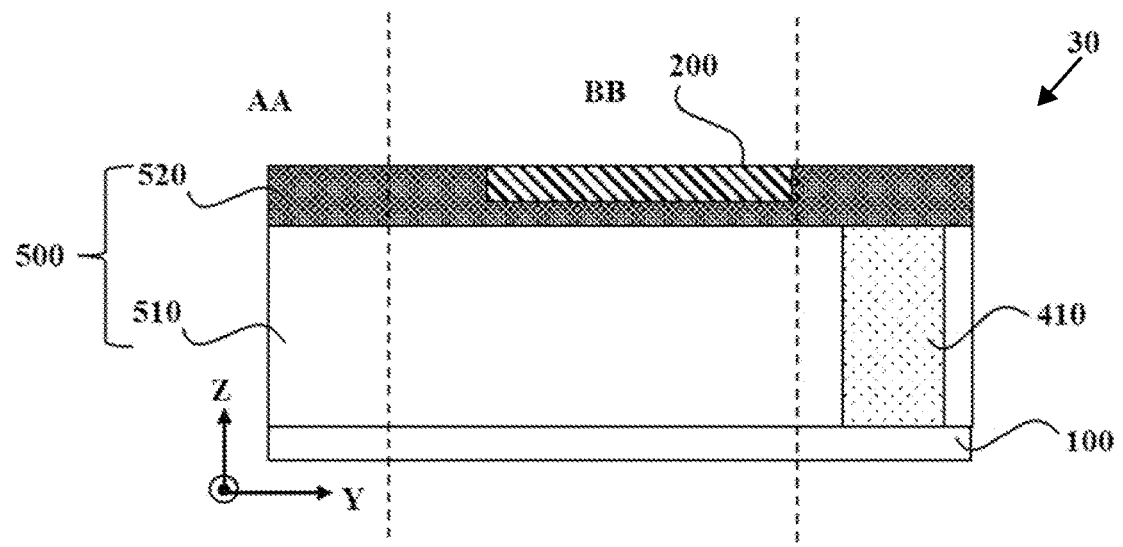
FIG. 3 illustrates a cross-sectional view of a display substrate taken along an axis C1C2 in FIG. 2 according to an embodiment of the present disclosure.

FIG. 3 illustrates a cross-sectional view of a display substrate taken along an axis C1C2 in FIG. 2 according to an embodiment of the present disclosure. As shown in FIG. 3, the display substrate 30 further includes a dielectric layer 500. The dielectric layer 500 is located on the substrate 100 and includes a first portion 510 and a second portion 520 that are arranged in sequence in a direction perpendicular to the substrate 100 (e.g., the Z direction). In an embodiment, the first portion 510 and the second portion 520 of the dielectric layer 500 may be integrally formed, and may include the same material. In other embodiments of the present disclosure, the first portion 510 and the second portion 520 of the dielectric layer 500 may also be formed separately, and may include the same or different materials.

In an embodiment of the present disclosure, the pad 200 is located in the second portion 520 of the dielectric layer 500. As shown in FIG. 2, an upper surface of the pad 200 overlaps with an upper surface of the second portion 520 of the dielectric layer 500 and is exposed. In some embodiments of the present disclosure, the upper surface of the pad 200 may be higher than the upper surface of the second portion 520 of the dielectric layer 500. In other embodiments of the present disclosure, the upper surface of the pad 200 may be lower than the upper surface of the second portion 520 of the dielectric layer 500 as long as it can be exposed by the second portion 520 of the dielectric layer 500.

In the embodiment of the present disclosure, the conductive sealing part 400 is located within the peripheral region BB and in the dielectric layer 500. The first portion 410 of the conductive sealing part 400 is located only in the first portion 510 of the dielectric layer 500. The first portion 410 of the conductive sealing part 400 is covered by the second portion 520 of the dielectric layer 500. As shown in FIG. 3, the upper surface of the first portion 410 of the conductive sealing part 400 may be coplanar with the upper surface of the first portion 510 of the dielectric layer 500. As shown in FIG. 3, the first portion 410 of the conductive sealing part 400 and the pad 200 is spaced by the second portion 520 of the dielectric layer 500, that is, the first portion 410 of the conductive sealing part 400 is covered by the second portion 520 of the dielectric layer. According to an embodiment of the present disclosure, since the portion of the conductive sealing part 400 adjacent to the pad 200 is always covered by the first portion 510 of the dielectric layer 500, the bonding pad on the flexible circuit board intended to be bonded with the pad 200 is prevented from undesirable electrical connections to the conductive sealing part 400 due to alignment deviation. As described above, the conductive sealing part 400 is usually coupled with the ground terminal, so the conductive sealing part 400 according to the embodiment of the present disclosure can avoid loss of internal electrical function of the corresponding functional circuits on the flexible circuit board due to the coupling of the bonding pad and the ground terminal.

Figure 4:
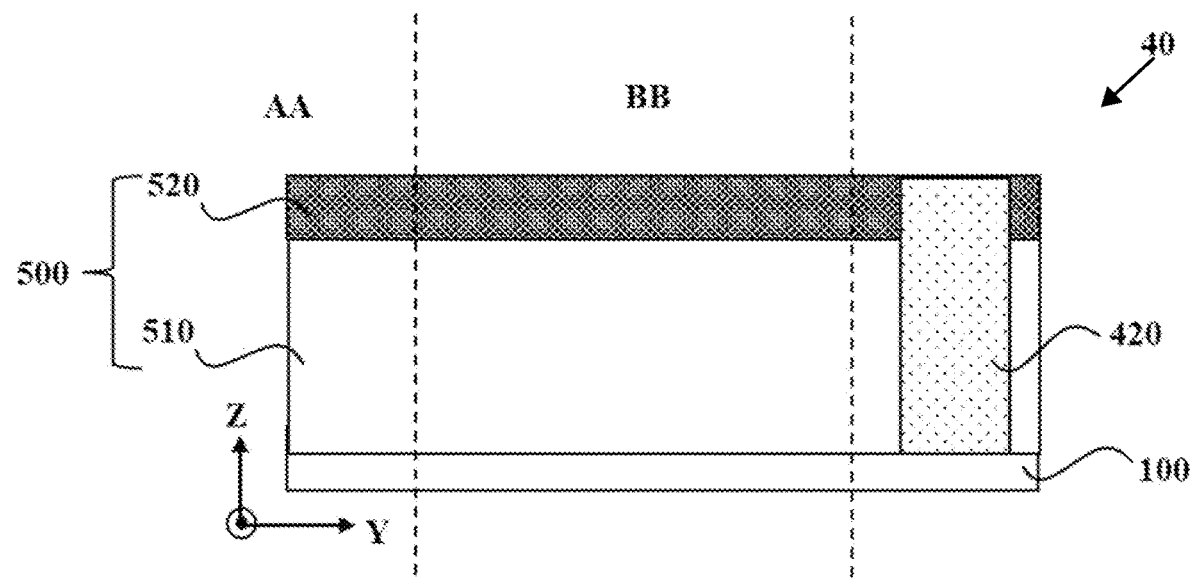
FIG. 4 illustrates a cross-sectional view of the display substrate taken along an axis D1D2 in FIG. 2 according to an embodiment of the present disclosure.

FIG. 4 further illustrates a cross-sectional view of the display substrate 40 taken along an axis D1D2 in FIG. 2 in accordance with an embodiment of the present disclosure. In an embodiment of the present disclosure, the second portion 420 of the conductive sealing part 400 extends to the top surface of the second portion 520 of the dielectric layer 500 on the side away from the substrate 100. The structure as shown in FIG. 4 differs from the structure as shown in FIG. 3 in that an upper surface of the second portion 420 of the conductive sealing part 400 is coplanar with the upper surface of the second portion 520 of the dielectric layer 500. This is only an example, and the upper surface of the second portion 420 of the conductive sealing part 400 may also be located between the upper surface and the lower surface of the second portion 520 of the dielectric layer 500.

According to an embodiment of the present disclosure, the second portion 420 of the conductive sealing part 400 may also have the same structure as the first portion 410 of the conductive sealing part 400, i.e., also covered by the second portion 520 of the dielectric layer 500.

According to an embodiment of the present disclosure, the conductive sealing part 400 may have a layered hierarchical structure. In an embodiment of the present disclosure, the conductive sealing part 400 includes conductive via layers and conductive wiring layers alternately stacked in a direction (Z direction) perpendicular to the substrate 100. In an embodiment of the present disclosure, the second portion 520 of the dielectric layer 500 may include a number of sub-dielectric layers less than or equal to three. In the embodiment of the present disclosure, the conductive sealing part 400 includes a first conductive wiring layer closest to the substrate 100, as the bottom layer of the conductive sealing part 400.

The structure of the first portion 410 of the conductive sealing part 400 will be described in detail below with reference to FIGS. 5 to 6.

Figure 5:
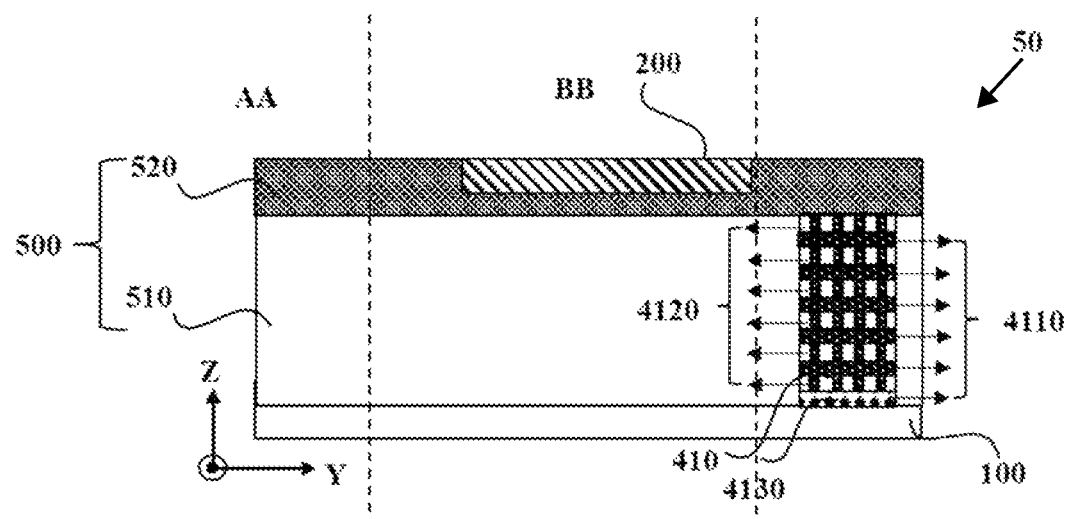
FIG. 5 shows a hierarchical diagram of a first portion 410 of the conductive sealing part shown in FIG. 3 according to an embodiment of the present disclosure.

FIG. 5 shows a view of the hierarchical structure 50 of the first portion 410 of the conductive sealing part 400 as shown in FIG. 3 according to an embodiment of the present disclosure. As shown in FIG. 5, the first portion 410 of the conductive sealing part 400 includes 6 conductive wiring layers 4110 and 6 conductive via layers 4120. According to an embodiment of the present disclosure, the second portion 520 of the dielectric layer 500 may include one sub-dielectric layer. According to an embodiment of the present disclosure, the second portion 420 of the conductive sealing part 400 includes 7 conductive wiring layers 4110 and 6 conductive via layers 4120. The conductive wiring layer 4120 includes a first conductive wiring layer 4130 closest to the substrate 100 in the direction (Z direction) perpendicular to the substrate 100. The first conductive wiring layer 4130 is the bottom layer (lowermost layer) of the first portion 410. In an embodiment, the material of the first conductive wiring layer 4130 includes a semiconductor, for example, polysilicon.

According to an embodiment of the present disclosure, in addition to the first conductive wiring layer 4130, the conductive wiring layer 4120 further includes other conductive wiring layers (e.g., the other 5 conductive wiring layers) located above the first conductive wiring layer 4130. In an embodiment of the present disclosure, the material of the other conductive wiring layers includes metal.

According to an embodiment of the present disclosure, the first portion 410 of the conductive sealing part 400 may include 5 conductive via layers 4110 and 6 conductive wiring layers 4120. In this case, the second portion 520 of the dielectric layer 500 includes two sub-dielectric layers.

According to an embodiment of the present disclosure, the first portion 410 of the conductive sealing part 400 may include 5 conductive via layers 4110 and 5 conductive wiring layers 4120. In this case, the second portion 520 of the dielectric layer 500 may include three sub-dielectric layers.

In addition, the inventors of the present disclosure have found through research that during the cutting process of separating the display substrates from the display motherboard having a plurality of display substrates, large cutting stress can be easily accumulated at a corner of the conductive sealing part 400, thereby causing the functionality of the display region near the corner to be impaired. Therefore, the present disclosure further provides a display substrate having a reinforced part. During the cutting process, the display substrate having such a structure can disperse the undesired stress by the reinforced part, for example, the reinforced part is cracked or removed to reduce or eliminate the stress on the corner, thereby protecting the display panel. Next, referring to FIG. 6, the substrate having such a structure will be described.

Figure 6:
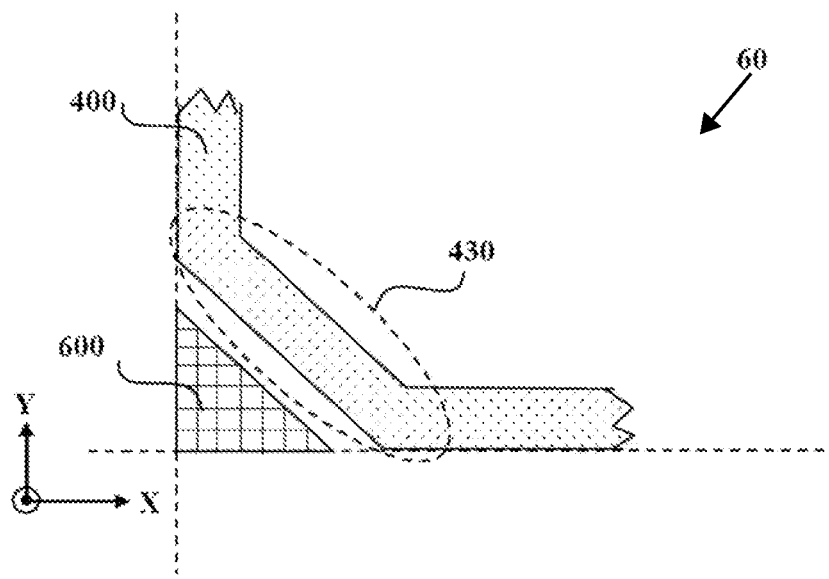
FIG. 6 shows a schematic diagram of a display substrate with a reinforced corner structure according to an embodiment of the present disclosure.

FIG. 6 shows a schematic diagram of a display substrate with reinforced part according to an embodiment of the present disclosure. In the display substrate 60, the conductive sealing part 400 has a corner 430. The display substrate 60 further includes a reinforced part 600 located in the dielectric layer 500 in the peripheral region BB and adjacent to the corner 430. The reinforced part 600 has a complementary shape to the corner 430.

In the embodiment of the present disclosure, the reinforced part 600 having a shape complementary to the corner 430 means that the portion of the reinforced part 600 and the portion of the corner 430 adjacent to each other has a conformal surface. As shown in FIG. 6, according to the embodiment of the present disclosure, the overall outer contour of the rectangular conductive sealing part 400 having the corners 430 and the reinforced part 600 is still in a rectangular shape. This is not limited, and in other embodiments of the present disclosure, the conductive sealing part 400 may have other annular shapes with corners, e.g., a square shape. In FIG. 6, for the sake of simplicity, only a part of the display substrate 60 is shown, and the remaining three reinforced corners may have the same or different structures with respect to that as shown in FIG. 6. For example, the upper left and upper right reinforced corners have the same structure but are different from the reinforced corner as shown in FIG. 6, while the lower right reinforced corner has the same structure as the reinforced corner as shown in FIG. 6. The display substrate 60 includes the rectangular conductive sealing part 400 having corners 430. As shown in FIG. 6, the reinforced part 600 has a right triangle shape, in particular, has an isosceles right triangle shape. It can be understood that the specific shape of the reinforced part 600 can be set according to the requirements of the specific embodiment. Reinforced part 600 has the complementary shape to the corner. In an embodiment, the reinforced part 600 may be formed in the dielectric layer 500. The reinforced part 600 may have the same hierarchical structure as the first portion 410 of the conductive sealing part 400. The reinforced part 600 is formed only in the first portion 510 of the dielectric layer 500 and is covered by the second portion 520 of the dielectric layer 500. The reinforced part 600 may include a plurality of conductive via layers and a plurality of conductive wiring layers in the first portion 510 of the dielectric layer 500. According to an embodiment of the present disclosure, the reinforced part 600 may include a plurality of configurations, for example, 6 conductive wiring layers and 6 conductive via layers, 6 conductive wiring layers and 5 conductive via layers, or 5 conductive wiring layers and 5 conductive via layers. According to an embodiment of the present disclosure, the reinforced part 600 may have the same hierarchical structure as the second portion 420 of the conductive sealing part 400 and be formed in the first portion 510 of the dielectric layer 500 and the second portion 520 of the dielectric layer 500, for example, it may include 7 conductive wiring layers and 6 conductive via layers.

According to an embodiment of the present disclosure, the reinforced part 600 may have a mesh structure. Correspondingly, each conductive via layer or conductive wiring layer included in the reinforced part 600 also has the corresponding mesh structure.

The present disclosure also provides a corresponding display motherboard. This will be described below with reference to FIGS. 7 and 8.

Figure 7:
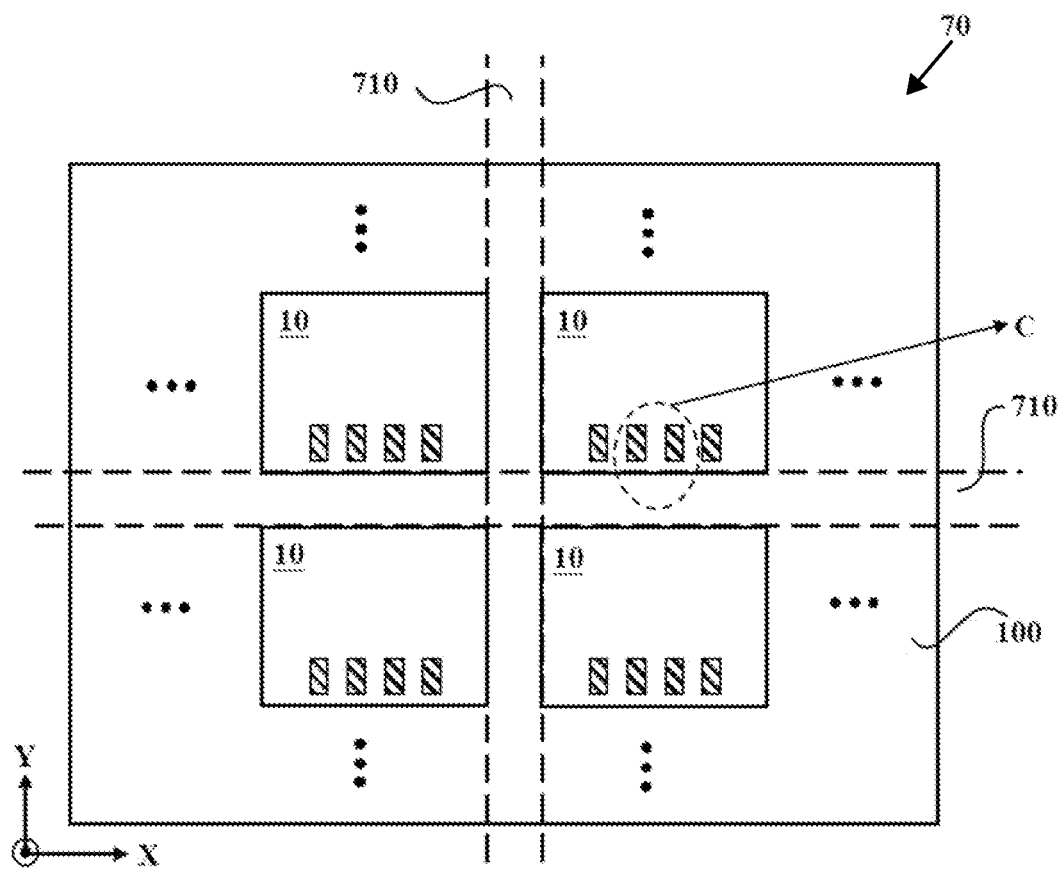
FIG. 7 shows a schematic diagram of a display motherboard according to an embodiment of the present disclosure.

FIG. 7 shows a schematic diagram of a display motherboard according to an embodiment of the present disclosure. In an embodiment of the present disclosure, the display motherboard 70 includes a plurality of display substrates, e.g., the display substrates 10 to 60. As shown in FIG. 7, the display substrates 10 to 60 are arranged in an array. The display motherboard 70 includes a cutting region 710 located between two adjacent display substrates 10. The arrangement of the pad and the adjacent cutting region will be described in detail below with reference to FIG. 8.

Figure 8:
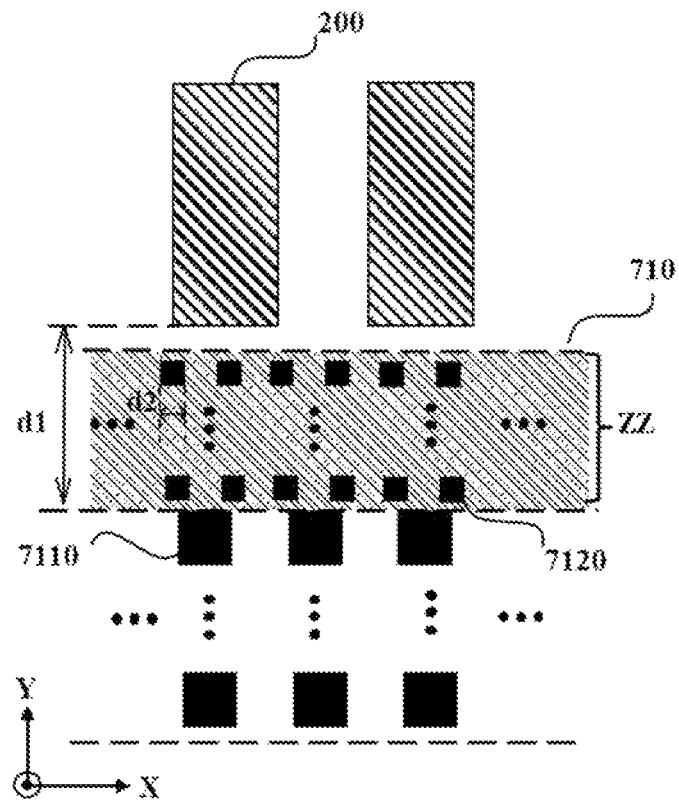
FIG. 8 illustrates a schematic diagram of a region C of the display motherboard in FIG. 7 according to an embodiment of the present disclosure.

FIG. 8 illustrates a schematic diagram of a region C of the display motherboard in FIG. 7 according to an embodiment of the present disclosure. As shown in FIG. 8, two adjacent pads 200 are spaced by a first distance d. In an embodiment, a plurality of pads 200 are arranged by equal space (e.g., the first distance d) in the X direction, and pads 200 are parallel to each other in the Y direction.

In an embodiment of the present disclosure, the cutting region 710 includes test pads 7110 and dummy patterns 7120. In an embodiment, although the test pads 7110 and the dummy patterns 7120 shown in FIG. 8 are square, this is not limited, and the test pads 7110 and the dummy patterns 7120 may also be of other shapes, such as circles, etc. In addition, although the dimensions of the test pads 7110 shown in FIG. 7 are consistent for the sake of clarity and simplicity of the drawing, this is not limited, and generally, the dimension of the test pad 7110 varies due to the different functions of the test pads 7110. In an embodiment of the present disclosure, the test pad 7110 may include a wafer alignment mark test element group (TEG), a wafer acceptability test TEG, a critical dimension TEG, and an overlap TEG. As shown in FIG. 8, the cutting region 710 is adjacent to the pad 200. The dummy pattern 7120 is located between the test pad 7110 and the pad 200 adjacent to the test pad 7110.

In the embodiment of the present disclosure, the space dl between the test pads 7110 and the pads 200 adjacent to the test pads 7110 is greater than the absolute value of the alignment accuracy when the circuit board is bonded to the display substrate 10. In practice, the absolute value of this alignment accuracy can be characterized, for example, by the minimum space between adjacent conductive wirings of the display substrate along in the direction parallel to the substrate. According to an embodiment of the present disclosure, the absolute value of the alignment accuracy may be about 2-5 times the minimum space. In an embodiment, the circuit board is bonded to the display substrate 10 via gold fingers. It should be understood that the alignment accuracy may be different for different circuit boards or different display substrates or different requirements. In an embodiment, the alignment accuracy may be ±30 μm. As shown in FIG. 8, the space dl between the test pad 7110 and the pad 200 in the Y direction is 40 μm-80 μm. By providing the space, it can be ensured that when bonding the bond pads of an external circuit, such as a flexible printed circuit board, to the pads 200, there is no short circuits due to the test pads undesirably connecting adjacent bond pads. It should be understood that those skilled in the art can further set the space according to specific applications and requirements. In other embodiments of the present disclosure, the dummy pattern 7120 may also have other shapes and sizes.

As shown in FIG. 8, the dummy pattern 7120 may be arranged in an array. The dummy pattern 7120 may have a square shape of 3 μm×3 μm. In other embodiments of the present disclosure, the dummy pattern 7120 may also have other shapes and sizes.

The present disclosure also proposes provides a display panel. A detailed description will be given below with reference to FIG. 9.

Figure 9:
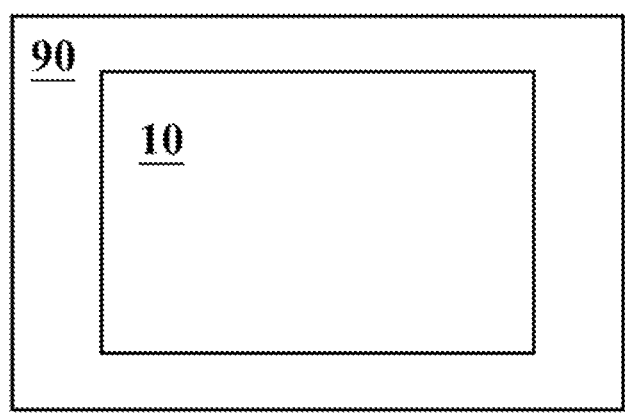
FIG. 9 shows a schematic diagram of a display panel according to an embodiment of the present disclosure.

FIG. 9 shows a schematic structural diagram of a display panel according to an embodiment of the present disclosure. As shown in FIG. 9, the display panel 90 may include the display substrates 10 to 60 according to any embodiment of the present disclosure.

In an embodiment of the present disclosure, the display panel 90 may further include a circuit board. The circuit board is electrically connected to the display substrate 10 via the pads 200. In an embodiment of the present disclosure, the circuit board may include a flexible circuit board.

The display panel 90 may be any product or component with a display function, such as a mobile phone, a tablet computer, a television, a monitor, a notebook computer, a digital photo frame, a navigator, and the like.

The display panel provided by the embodiment of the present disclosure has the same or similar beneficial effects as the display substrate provided by the previous embodiments of the present disclosure. Since the display substrate has been described in detail in the previous embodiment, the description of that will be omit.

The foregoing description of the embodiments has been provided for the purposes of illustration and description. It is not intended to be exhaustive or to limit this application. The respective elements or features of a particular embodiment are generally not limited to a particular embodiment, but when it's appropriate, these elements or features are interchangeable and can be used in a selected embodiment, even if not specifically shown or described. The same can also be changed in many ways. Such changes are not to be considered a departure from this application, and all such modifications are included within the scope of this application.

What is claimed is:

1. A display substrate comprising a central region and a peripheral region surrounding the central region, the display substrate comprising:
   a substrate;
   a dielectric layer located on the substrate and comprising a first portion and a second portion arranged in sequence in a direction perpendicular to the substrate;
   a pad located within the peripheral region on the substrate, wherein at least a portion of a surface of the pad on a side away from the substrate is exposed; and
   a conductive sealing part located within the peripheral region and in the dielectric layer, wherein the conductive sealing part comprises at least a first portion adjacent to the pad in a direction parallel to the substrate, and wherein the first portion of the conductive sealing part is covered by the second portion of the dielectric layer.

2. The display substrate according to claim 1, wherein the conductive sealing part further comprises a second portion not adjacent to the pad in the direction parallel to the substrate, and wherein the second portion extends to a top surface of the second portion of the dielectric layer away from the substrate.

3. The display substrate according to claim 2, wherein the conductive sealing part comprises conductive via layers and conductive wiring layers alternately stacked in the direction perpendicular to the substrate.

4. The display substrate according to claim 3, wherein the conductive wiring layers comprise a first conductive wiring layer closest to the substrate in the direction perpendicular to the substrate, as a bottom layer of the conductive sealing part.

5. The display substrate according to claim 4, wherein a material of the first conductive wiring layer comprises a semiconductor.

6. The display substrate according to claim 5, wherein the semiconductor comprises polysilicon.

7. The display substrate according to claim 6, wherein the conductive wiring layers further comprise a second conductive wiring layer located above the first conductive wiring layer, and wherein a material of the second conductive wiring layer comprises metal.

8. The display substrate according to claim 7, the first portion of the conductive sealing part comprising any of the following configurations:
   6 conductive wiring layers and 6 conductive via layers;
   6 conductive wiring layers and 5 conductive via layers;
   5 conductive wiring layers and 5 conductive via layers; and
   7 conductive wiring layers and 6 conductive via layers.

9. The display substrate according to claim 1, wherein the pad is located in the second portion of the dielectric layer.

10. The display substrate according to claim 1, wherein the conductive sealing part has an annular shape surrounding the central region.

11. The display substrate according to claim 10, wherein the conductive sealing part comprises a first ring portion and a second ring portion arranged in sequence in a direction away from the central region.

12. The display substrate according to claim 11, wherein the conductive sealing part comprises a corner, wherein the display substrate further comprises a reinforced part located in the dielectric layer within the peripheral region and adjacent to the corner, and wherein the reinforced part has a shape complementary to the corner.

13. The display substrate according to claim 12, wherein the reinforced part has a mesh structure.

14. The display substrate according to claim 1, wherein the display substrate comprises a backplane driving integrated circuit.

15. The display substrate according to claim 14, wherein a material of the substrate comprises a semiconductor material.

16. A display motherboard comprising a plurality of display substrates according to claim 1.

17. The display motherboard according to claim 16, further comprising a test pad and a dummy pattern located within a cutting region of the adjacent display substrate, wherein the dummy pattern is located between the test pad and the pad adjacent to the test pad.

18. The display motherboard according to claim 17, wherein a space between the test pad and the pad adjacent to the test pad is configured to be greater than a minimum space between adjacent conductive wirings of the display substrate in the direction parallel to the substrate.

19. A display panel comprising the display substrate according to claim 1.

20. The display panel of claim 19, further comprising a circuit board, wherein the circuit board is electrically connected to the display substrate via the pads.

* * * * *